US010187993B2

(12) United States Patent
Lee

(10) Patent No.: US 10,187,993 B2
(45) Date of Patent: Jan. 22, 2019

(54) DEVICE HAVING CIRCUIT BOARD

(71) Applicant: SAMSUNG SDI CO., LTD., Yongin-si, Gyeonggi-do (KR)

(72) Inventor: Jun Young Lee, Yongin-si (KR)

(73) Assignee: SAMSUNG SDI CO., LTD., Yongin-si, Gyeonggi-do (KR)

(*) Notice: Subject to any disclaimer, the term of this patent is extended or adjusted under 35 U.S.C. 154(b) by 60 days.

(21) Appl. No.: 15/086,101

(22) Filed: Mar. 31, 2016

(65) Prior Publication Data
US 2017/0055352 A1    Feb. 23, 2017

(30) Foreign Application Priority Data

Aug. 21, 2015 (KR) .................. 10-2015-0118225

(51) Int. Cl.
H05K 5/00   (2006.01)
H05K 1/18   (2006.01)
H05K 7/14   (2006.01)
H05K 1/02   (2006.01)

(52) U.S. Cl.
CPC ............ *H05K 1/181* (2013.01); *H05K 7/142* (2013.01); *H05K 1/0215* (2013.01); *H05K 2201/10053* (2013.01); *H05K 2201/10166* (2013.01); *H05K 2201/10181* (2013.01); *H05K 2201/10189* (2013.01); *H05K 2201/10196* (2013.01)

(58) Field of Classification Search
CPC ...... H05K 5/006; H05K 5/0052; H05K 7/142; H05K 2201/10053; H05K 2201/10166; H05K 2201/10181; H05K 2201/10189; H05K 2201/10196
See application file for complete search history.

(56) References Cited

U.S. PATENT DOCUMENTS

| 5,563,771 | A  | * | 10/1996 | Bethurum | G06K 19/077 257/679 |
| 5,761,046 | A  | * | 6/1998  | Hein     | H05K 5/0043 174/541 |
| 6,501,030 | B1 | * | 12/2002 | Parizi   | H01R 12/585 174/250 |
| 6,560,119 | B1 | * | 5/2003  | Katsuyama | G06F 1/183 174/138 D |
| 6,639,804 | B1 | * | 10/2003 | Chen     | H01L 23/36 165/185 |
| 9,848,518 | B2 | * | 12/2017 | Yuan     | H05K 7/209 |
| 2004/0264113 | A1 | * | 12/2004 | Darr | H05K 7/142 361/601 |

(Continued)

FOREIGN PATENT DOCUMENTS

| KR | 10-2005-0031759 A | 4/2005 |
| KR | 10-2005-0031761 A | 4/2005 |
| KR | 20-2011-0009807 U | 10/2011 |

*Primary Examiner* — Hoa C Nguyen
*Assistant Examiner* — Christopher L Augustin
(74) *Attorney, Agent, or Firm* — Lee & Morse P.C.

(57) ABSTRACT

A device includes a circuit board, a plastic case accommodating the circuit board therein, the plastic case protecting the circuit board, and a plurality of conductive support members supporting the circuit board such that the circuit board is fixed to the plastic case. In the device, the conductive support members are fixed to the circuit board inside the plastic case, and extend to the outside of the plastic case to be fixed to the plastic case.

14 Claims, 5 Drawing Sheets

(56) References Cited

U.S. PATENT DOCUMENTS

| | | | | |
|---|---|---|---|---|
| 2007/0097023 A1* | 5/2007 | Kim | ...................... | H05K 7/142 |
| | | | | 345/31 |
| 2007/0152697 A1* | 7/2007 | Hsu | ...................... | H05K 1/0215 |
| | | | | 324/763.01 |
| 2007/0195219 A1* | 8/2007 | Moon | ................... | G06F 1/1626 |
| | | | | 349/58 |
| 2008/0055512 A1* | 3/2008 | Kim | ................. | G02F 1/133308 |
| | | | | 349/58 |
| 2008/0268671 A1* | 10/2008 | Harris | ................. | H01H 85/046 |
| | | | | 439/76.2 |
| 2009/0122494 A1* | 5/2009 | Schmidt | ............... | H05K 7/1417 |
| | | | | 361/720 |
| 2010/0079960 A1* | 4/2010 | Liao | ...................... | G06F 1/184 |
| | | | | 361/752 |
| 2011/0127072 A1* | 6/2011 | Sun | ........................ | G06F 1/184 |
| | | | | 174/255 |
| 2011/0248136 A1* | 10/2011 | Shen | ...................... | H05K 7/142 |
| | | | | 248/300 |
| 2012/0000387 A1* | 1/2012 | Nance | .................... | F42B 3/103 |
| | | | | 102/202.9 |
| 2012/0217361 A1* | 8/2012 | Kuo | ...................... | H05K 7/142 |
| | | | | 248/222.13 |
| 2015/0146364 A1* | 5/2015 | Chou | ..................... | H05K 7/142 |
| | | | | 361/679.32 |
| 2016/0366771 A1* | 12/2016 | Schmit | .................. | H05K 5/006 |

\* cited by examiner

DEVICE HAVING CIRCUIT BOARD

CROSS-REFERENCE TO RELATED APPLICATION

Korean Patent Application No. 10-2015-0118225, filed on Aug. 21, 2015, in the Korean Intellectual Property Office, and entitled: "Device Having Circuit Board," is incorporated by reference herein in its entirety.

BACKGROUND

1. Field

An aspect relates to a device having a circuit board.

2. Description of the Related Art

An electric or electronic device may have a circuit board on which several elements are mounted, to thereby perform various functions. A device having a circuit board may independently perform a desired function by using elements mounted on the circuit board.

SUMMARY

Embodiments are directed to a device including a circuit board, a plastic case accommodating the circuit board therein, the plastic case protecting the circuit board, and a plurality of conductive support members supporting the circuit board such that the circuit board is fixed to the plastic case. The conductive support members are fixed to the circuit board inside the plastic case, and extend toward the outside of the plastic case to be fixed to the plastic case.

The plastic case may include a base on which the circuit board is mounted and a cover fastened to the circuit board and the base. The plurality of conductive support members may extend toward the outside of the plastic case between the cover and the circuit board.

The plurality of conductive support members may include first and second conductive support members. The first conductive support member may be fastened to the circuit board and the base inside the plastic case. The second conductive support member may be fastened to the cover, the circuit board, and the base inside the plastic case.

The device may further include a first fastening bolt that fastens the first conductive support member to the base by sequentially passing through the first conductive support member and the circuit board.

The device may further include a second fastening bolt that fastens the second conductive support member to the base by sequentially passing through the cover, the second conductive support member, and the circuit board.

The second conductive support member may be fixed to the cover, the circuit board, and the base at a corner of the cover.

The base may include a plurality of sidewalls surrounding an edge of the circuit board and a plurality of guide ribs protruding toward the edge of the circuit board to guide a mounting position of the circuit board.

A stepped portion may be provided at the sidewalls of the base to engage with an edge of the cover. A stepped portion may be provided at the edge of the cover to engage with the stepped portion of the sidewalls of the base.

The base may include a guide groove that guides a portion of the conductive support member that extends toward the outside of the plastic case.

The base may include a flange extending outwardly, the flange including at least one fixing hole having a reinforcing rib extending upwardly from the circumference thereof.

Each conductive support member of the plurality of conductive support members may include a stepped portion at a location where the conductive support member extends toward the outside of the plastic case.

The plurality of conductive support members may extend toward the base between the cover and the circuit board and then extend along a surface of the base.

At least one of the plurality of conductive support members may be electrically connected to a ground line of the circuit board.

The device may further include a plurality of elements mounted on the circuit board, the plurality of elements including at least one of a connection terminal, a relay, a fuse, a field effect transistor (FET), an integrated circuit (IC), a positive temperature coefficient (PTC), and a switching element.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
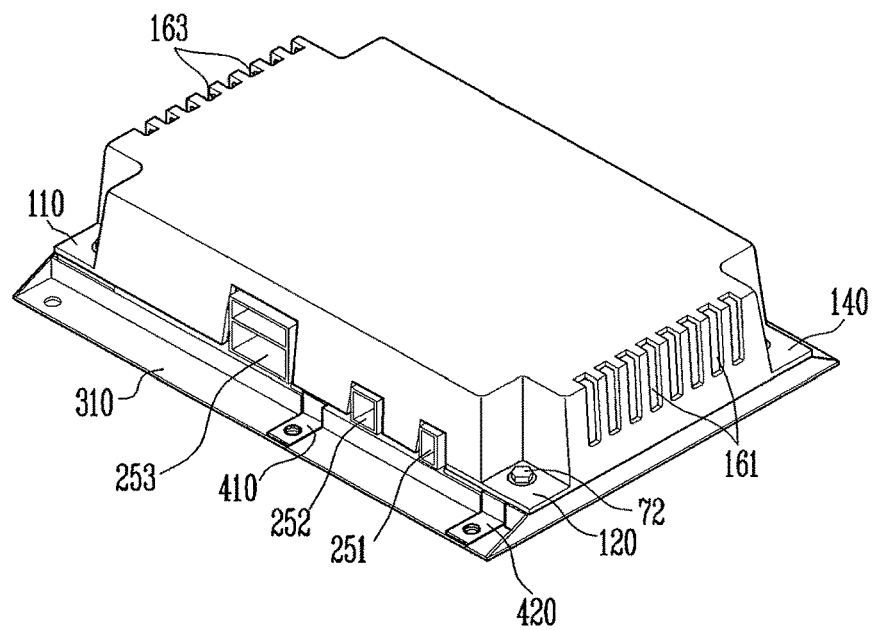
FIG. 1 illustrates a perspective view of a device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

Figure 2:
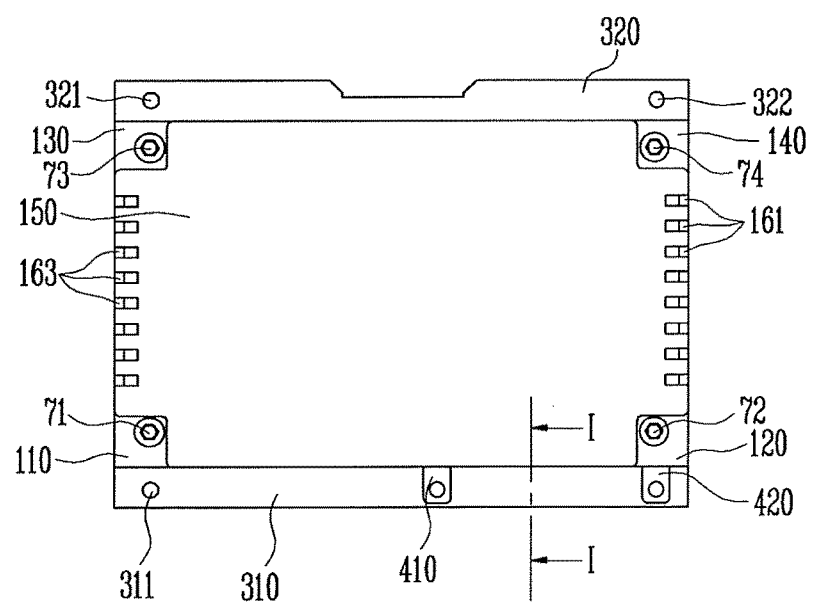
FIG. 2 illustrates a top view of the device illustrated in FIG. 1.
Figure 3:
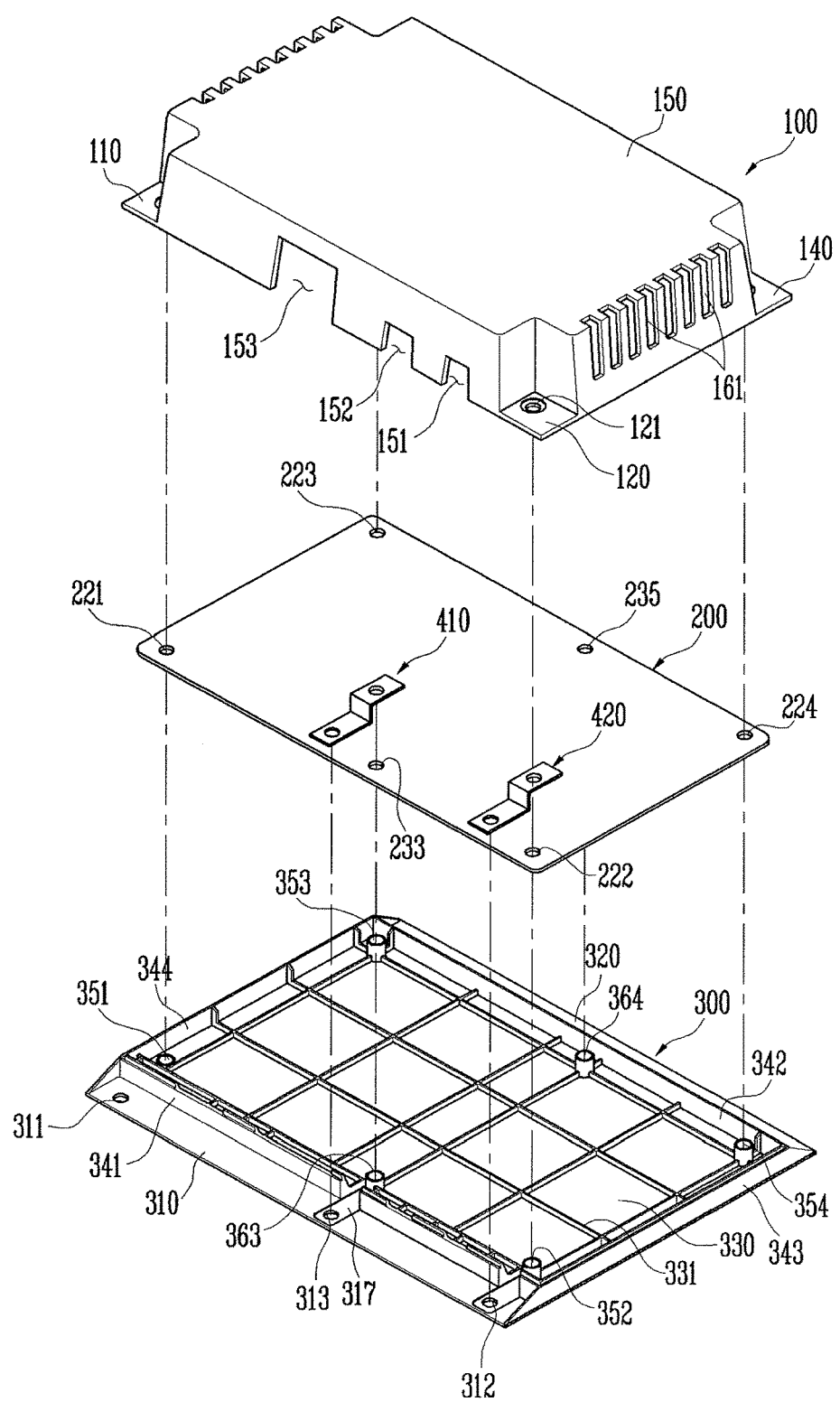
FIG. 3 illustrates an exploded perspective view of the device illustrated in FIG. 1.

Throughout the specification, when an element is referred to as being "connected" or "coupled" to another element, it can be directly connected or coupled to the another element or be indirectly connected or coupled to the another element with one or more intervening elements interposed therebetween. In the following description, detailed explanation of known related functions and constitutions may be omitted to avoid unnecessarily obscuring the subject manner FIG. 1 illustrates a perspective view of a device according to an embodiment. FIG. 2 illustrates a top view of the device of FIG. 1. FIG. 3 illustrates an exploded perspective view of the device of FIG. 1.

The device according to the embodiment may include plastic case 100 and 300, a circuit board 200, and a plurality of conductive support members 410 and 420. The circuit board may be protected by being accommodated in the plastic case. The circuit board may be fixed to the plastic case and supported by the plurality of conductive support members. A plurality of connectors 251, 252 and 253 to electrically connect the circuit board to an external device including an external power source may be mounted to the circuit board. The plurality of connectors may be exposed to the outside of the plastic case.

Hereinafter, for convenience of illustration, a surface where the plurality of connectors 251, 252, and 253 are exposed in FIG. 1 will be referred to as a front surface, a surface opposite to the front surface will be referred to as a rear surface, and surfaces extending from the front surface to the rear surface will be referred to as side surfaces.

The plastic case 100 and 300 may include a base 300 on which the circuit board 200 is mounted and a cover 100 that is fastened to the base 300 to cover the circuit board 200. The plastic case may be an injection-molded product and may include a plurality of ribs.

The base 300 may include a bottom surface 330 facing the circuit board 200, a plurality of sidewalls 341, 342, 343, and 344 extending upward from the bottom surface 330, the sidewalls 341, 342, 343, and 344 forming a frame that surrounds a periphery of the circuit board 200, and a pair of flanges 310 and 320 extending outward from the bottom surface 330.

The bottom surface 330 may have an approximately quadrangular plate-like body, and may include support ribs 331 therein. The support ribs 331 may extend toward the circuit board 200 from the bottom surface 330 and may be arranged in, for example, lattice shape.

The plurality of sidewalls 341, 342, 343, and 344 may extend upward from the bottom surface 330 to form a quadrangular frame. The plurality of sidewalls 341, 342, 343, and 344 may extend to a height at least equal to or greater than a height at which the circuit board 200 is mounted. The plurality of sidewalls may include a first sidewall 341 extending from a front of the bottom surface 330, a second sidewall 342 extending from at a rear of the bottom surface 330, and third and fourth sidewalls 343 and 344 extending from the bottom surface 330 between the first and second sidewalls 341 and 342.

A plurality of guide ribs extending toward the frame of the circuit board 200 to guide the circuit board 200 to be mounted at a normal position may be provided to the plurality of sidewalls. The base 300 may include first to fourth bolt insertion portions 351, 352, 353, and 354 respectively provided adjacent to corners formed where the plurality of sidewalls meet each other. Each of the first to fourth bolt insertion portions 351, 352, 353, and 354 may have a cylindrical shape having a bore and may be disposed such that its opening faces the circuit board 200. A screw thread may be formed in the bore.

Figure 4:
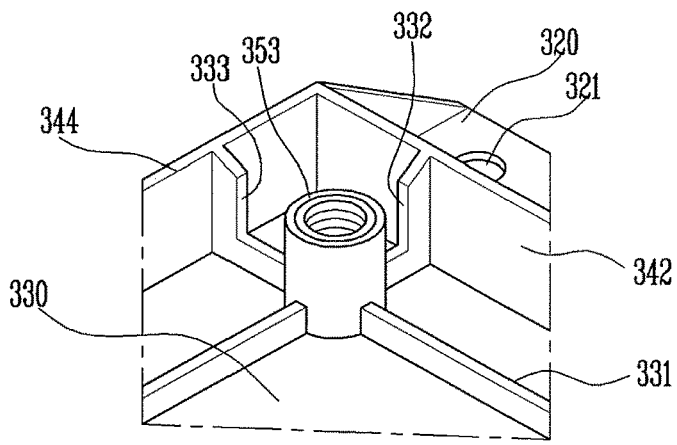
FIG. 4 illustrates an enlarged perspective view showing a corner portion of a base illustrated in FIG. 3.

FIG. 4 illustrates a perspective view showing a corner portion of the base 300. The guide ribs and the bolt insertion portions will be described in detail with reference to FIGS. 1 to 4. The positions of the insertion portions may be any positions corresponding to the positions of a plurality of board fixing holes formed in the circuit board 200, For example, referring to FIG. 4, a corner portion may be formed by the second sidewall 342 and the fourth sidewall 344. The third bolt insertion portion 353 may be provided on the bottom surface 330 of the base 300 adjacent to and surrounded by the corner.

A pair of guide ribs may be provided at each of the four corners of the base 300. For example, a plurality of guide ribs may be provided extending from each sidewall at positions connected to the support ribs 331 arranged in the lattice shape as shown in FIG. 3. For example, as shown in FIG. 4, a guide rib 332 may extend inwardly from the second sidewall 342 at a position opposite to the third bolt insertion portion 353, and another guide rib 333 may extend inwardly from the fourth sidewall 344 at a position opposite to the third bolt insertion portion 353.

The pair of flanges 310 and 320 may include a first flange 310 extending substantially horizontally from the front of the bottom surface 330 toward the outside and a second flange 320 extending substantially horizontally from the rear of the bottom surface 330 toward the outside. Each of the first and second flanges 310 and 320 may be an approximately rectangular plate-like body, and may have a thickness equal to that of the bottom surface 330.

The first flange 310 may have a horizontal length equal to that of the first sidewall 341. The first flange 310 may extend toward the outside to a sufficient extent such that the flange 310 may support the plastic case. The first flange 310 may be supported at both ends in the horizontal length direction of the first flange 310 by triangular plates formed as extensions from the third and fourth sidewalls 343 and 344 and connected to the first flange 310.

The second flange 320 may have a horizontal length equal to that of the second sidewall 342. The second flange 320 may extend toward the outside by a same distance that the first flange 310 extends to the outside. In some implementations, the distance that the second flange 320 extends to the outside may be different from the distance that the first flange 310 extends to the outside. The second flange 320 may be supported at both end in the horizontal length direction of the second flange 320 by triangular plates formed as extensions from the third and fourth sidewalls 343 and 344 and connected to the second flange 320.

Referring to FIG. 2, a cut-away portion having an approximately trapezoidal shape may be formed at an outer edge of a central portion of the second flange 320.

In some implementations, flanges may be further provided at sides of the bottom surface. In some implementations, the thickness of the flange may be greater than the thickness of the bottom surface and smaller than or equal to the height of the sidewall.

A plurality of case fixing holes 311, 312, 313, 321, and 322 for fixing the plastic case to an arbitrary object or location may be formed in the pair of flanges 310 and 320. The shape, positions, and number of the case fixing holes may be varied. For example, the case fixing holes may be circular holes passing through the pair of flanges in a thickness direction.

As an example, three case fixing holes 311, 312, and 313 may be formed in the first flange 310 to be spaced apart from each other in the horizontal length direction of the first flange 310. When the three fixing holes are, for convenience, referred to as first to third case fixing holes 311, 312, and 313, the first and second case fixing holes 311 and 312 may be respectively provided at both ends in the horizontal length direction of the first flange 310, and the second case fixing hole 312 may be formed at a position corresponding to one of the conductive support members that will be described below. The third case fixing hole 313 may be disposed between the first and second case fixing holes 311 and 312. The third case fixing hole 313 may be formed at a position corresponding to another of conductive support members.

As an example, a plurality of case fixing holes may also be formed in the second flange 320. Referring to FIG. 2, case fixing holes 321 and 322 may be respectively provided at both ends in the horizontal length direction of the second flange 320.

As examples, a fifth bolt insertion portion 363 may be further provided between the first and second bolt insertion portions 351 and 352 on the bottom surface 330 of the base 300, and a sixth bolt insertion portion 364 may be further provided between the third and fourth bolt insertion portions 353 and 354 on the bottom surface 330 of the base 300. The fifth and sixth bolt insertion portions 363 and 364 have the same shape as the first to fourth bolt insertion portions 351, 352, 353, and 354. The fifth bolt insertion portion 363 may be disposed adjacent to the first sidewall 341, and the sixth bolt insertion portion 364 may be disposed adjacent to the second sidewall 342.

A plurality of elements may be mounted on the circuit board 200. The circuit board 200 may be accommodated in the plastic case 100 and 300 and fixed to the plastic case 100 and 300. The circuit board 200 may be mounted to be slightly spaced apart from the bottom surface 330 of the base 300. The edges of the circuit board 200 may be guided while coming in contact with the guide ribs 332 and 333, such that the circuit board 200 is mounted at a normal position. Here, the term "normal position" refers to a specific position of the base in which the circuit board 200 is designed to be mounted. The normal position may include a clearance that is an allowable error in design.

The circuit board 200 may be a board having an approximately quadrangular shape. Fixing holes may be provided to correspond to the position of the board fixing holes. For example, first to fourth board fixing holes 221, 222, 223, and 224 may be respectively formed adjacent to the four corners of the circuit board 200. A fifth board fixing hole 233 may be formed between the first and second board fixing holes 221 and 222, and a sixth board fixing hole 235 may be formed between the third and fourth board fixing holes 223 and 224. For example, three board fixing holes may be formed adjacent to a front edge of the circuit board 200, and three board fixing holes are formed adjacent to a rear edge of the circuit board 200.

The plurality of elements that are mounted on the circuit board 200 may include at least one of a connection terminal, a relay, and a fuse such that the device according to an implementation may serve as a junction box. As another implementation, the plurality of elements may include at least one of a field effect transistor (FET), an integrated circuit (IC), a positive temperature coefficient (PTC), and a switching element such that the device may serve as a control device for controlling charging/discharging of a secondary battery or controlling a protective circuit of the secondary battery or charging/discharging of the secondary battery.

The plurality of conductive support members 410 and 420 may be fixed to the circuit board 200 inside the plastic case and may extend toward the outside of the plastic case to be fixed to the plastic case. The conductive support members may include a first conductive support member 410 and a second conductive support member 420. The first and second conductive support members 410 and 420 may be members that have a same shape and are coupled to the plastic case at different positions. The shape of the first conductive support member 410 will be described in detail with reference to FIG. 7.

The first conductive support member 410 may be a plate-like body that has a stepped portion formed in its extended length direction and has a predetermined width. The first conductive support member 410 may be made of a metallic material to have a rigidity to an extent such that the first conductive support member 410 can firmly support the circuit board 200. The first conductive support member 410 may include a board fixing surface 411 disposed adjacent to the edge of the circuit board 200 to be fixed on the circuit board 200, a stepped surface 412 extending from an end portion of the board fixing surface 411 toward the outside of the plastic case, the stepped surface 412 extending to bend downwardly, and a case fixing surface 413 extending from an end portion of the stepped surface 412 toward the outside in a direction identical to the direction in which the first flange 310 extends.

Figure 7:
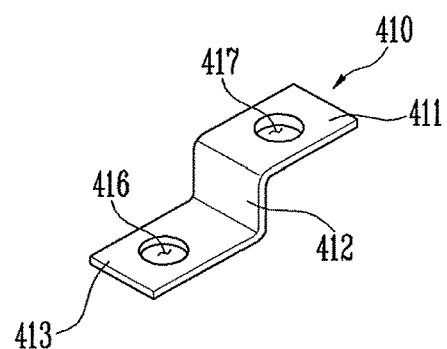
FIG. 7 illustrates a perspective view of a conductive support member illustrated in FIG. 3.

Through-holes may be formed in the board fixing surface 411 and the case fixing surface 413, respectively. The through-hole 417 of the board fixing surface 411 my be a hole in communication with one of the board fixing holes formed in the circuit board 200. The through-hole 416 of the case fixing surface 413 may be a hole in communication with one of the case fixing holes formed in the first flange 310. FIG. 7 illustrates the first conductive support member 410, but it is be understood that the configuration described with reference to FIG. 7 may also be applied to the second conductive support member 420.

Referring to FIG. 3, the through-hole 417 of the board fixing surface 411 of the first conductive support member 410 may be aligned with the fifth board fixing hole 233 of the circuit board 200, and fastened, together with the fifth board fixing hole 233, to the fifth bolt insertion portion 363 of the base 300 by a bolt. The first conductive support member 410 may be fastened to the circuit board 200 and the base 300 inside the plastic case. The one bolt may be screw-coupled to the fifth bolt insertion portion 363 by sequentially passing the bolt through the through-hole 417 of the board fixing surface 411 of the first conductive support member 410 and the fifth board fixing hole 233 of the circuit board 200.

Referring to FIGS. 1 to 3, the first conductive support member 410 may be disposed on the circuit board 200 such that the through-hole 417 of the board fixing surface 411 corresponds to the fifth board fixing hole 233, and the stepped surface 412 extends to bend downwardly from the frame of the circuit board 200. The case fixing surface 413 of the first conductive support member 410 may extend above the first flange 310. In this state, the case fixing surface 413 may extend in the same direction as the direction in which the first flange 310 extends toward the outside. The through-hole 416 of the case fixing surface 413 may be located on the first flange 310 to correspond to the fifth case fixing hole 313 of the first flange 310.

A first guide groove 317 to guide a portion at which the first conductive support member 410 extends toward the outside of the plastic case may be formed in the first sidewall 341 and the first flange 310. The first sidewall 341 may be open to an upper surface of the first flange 310 such that the portion at which the stepped surface 412 extends downwardly can be inserted. The first guide groove 317 may be formed in the shape of a recessed groove on the first flange 310. The width of the first guide groove 317 may be formed slightly greater than the width of the first conductive support member 410 such that the first conductive support member 410 may be inserted into the guide groove 317.

A second guide groove to guide a portion at which the second conductive support member 420 extends toward the outside of the plastic case may be formed in the first sidewall 341 and the first flange 310. The second guide groove may be identical to the above-described first guide groove except that the second guide groove may be disposed corresponding to the position at which the second conductive support member is provided.

The cover 100 may be a member that covers the circuit board 200. The cover 100 may include a cover body 150 that is concavely formed with respect to the circuit board 200 to have a space therein. The cover body 150 may include a roughly flat upper surface, sidewalls diagonally extending toward the sidewalls of the base 300 from the edge of the upper surface. The sidewalls may have four recessed corner portions, and four cover fixing surfaces 110, 120, 130, and 140 respectively formed at the four recessed corner portions of the sidewalls. The four cover fixing surfaces 110, 120, 130, and 140 may be fastened to the circuit board 200 and the base 300. A plurality of through-holes 151, 152, and 153 may be formed in the sidewall at the front surface of the cover body 150 such that the plurality of connectors 251, 252, and 253 are exposed therethrough.

The four cover fixing surfaces 110, 120, 130, and 140 may be disposed to face the circuit board 200. The four cover fixing surfaces 110, 120, 130, and 140 may be fixed to the circuit board 200 and the base 300. For convenience of illustration, the four cover fixing surfaces are sequentially referred to as first to fourth cover fixing surfaces 110, 120, 130, and 140.

The first cover fixing surface 110 may be disposed to face the corner at which the first board fixing hole 221 of the circuit board 200 is formed. The second cover fixing surface 120 may be disposed to face the corner at which the second board fixing hole 222 is formed. The third cover fixing surface 130 may be disposed to face the corner at which the third board fixing hole 223 of the circuit board 200 is formed, and the fourth cover fixing surface 140 may be disposed to face the corner at which the fourth board fixing hole 224 of the circuit board 200 is formed.

Cover fixing holes may be formed in the first to fourth cover fixing surfaces 110, 120, 130, and 140, respectively. The cover fixing hole may be formed to have the same center axis as the board fixing hole formed at the facing corner of the circuit board 200. Hereinafter, for convenience of illustration, the cover fixing holes formed in the first to fourth cover fixing surfaces 110, 120, 130, and 140 are referred to as first to fourth cover fixing holes, respectively. Also, a stepped portion may be formed on an upper surface of each of the first to fourth cover fixing holes such that at least one portion of the head of a bolt can be inserted into the cover fixing hole.

Figure 5:
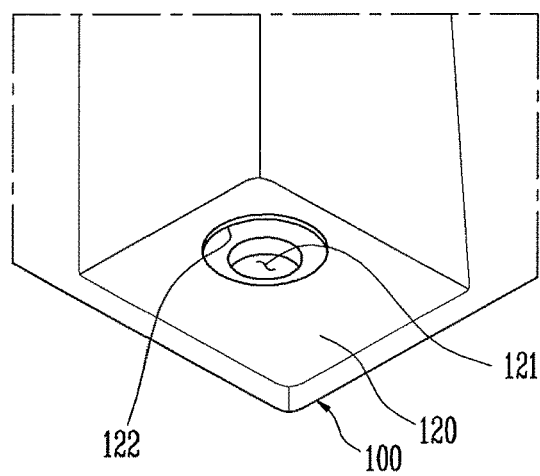
FIG. 5 illustrates a partial enlarged perspective view of a cover corner illustrated in FIG. 3.

Referring to FIG. 5, a second cover fixing hole 121 may be formed in the second cover fixing surface 120. A stepped portion 122 having an inner diameter wider than that of the second cover fixing hole 121 may be formed at an upper surface of the second cover fixing hole 121 such that the head of a bolt inserted into the second cover fixing hole 121 can be partially inserted into the second cover fixing hole 121. The stepped portion 122 may protect the bolt by surrounding the outer diameter of the bolt. The description of the second cover fixing hole 121 and the stepped portion 122 in the second cover fixing surface 120 may be identically applicable to the first, third, and fourth cover fixing surfaces 110, 130, and 140.

The second cover fixing hole 121 may be a circular hole passing through the second cover fixing surface 120 in a thickness direction. A cover fixing bolt 72 may be inserted into the second cover fixing hole 121. Referring to FIG. 2, cover fixing bolts may be inserted into the first to fourth cover fixing surfaces 110, 120, 130, and 140, respectively. For convenience of illustration, the bolt inserted into the first cover fixing surface 110 is referred to as a first bolt 71, and, similarly, the bolts inserted into the second to fourth cover fixing surfaces 120, 130, and 140 are referred to as second to fourth bolts 72, 73, and 74, respectively.

Referring to FIG. 3, the second cover fixing surface 120 may be fastened to the second bolt insertion portion 352 of the base 300 as the second bolt 72 sequentially passes through the second cover fixing hole 121, the through-hole formed in the board fixing surface of the second conductive support member 420, and the second board fixing hole 222 of the circuit board 200. The head of the second bolt 72 may be protected by the stepped portion formed at the upper surface of the second cover fixing hole 121.

According to the configuration described above, the cover 100, the second conductive support member 420, the circuit board 200, and the base 300 may be fastened and fixed to one another by a single bolt, such that the assembling structure of the device can be simplified.

The first bolt 71 may be fastened to the first bolt insertion portion 351 of the base 300 by sequentially passing through the first cover fixing hole formed in the first cover fixing surface 110 and the first board fixing hole 221 of the circuit board 200. Similarly, the third bolt 73 may be fastened to the third bolt insertion portion 353 of the base 300 by sequentially passing through the third cover fixing hole formed in the third cover fixing surface 130 and the third board fixing hole 223 of the circuit board 200. The fourth bolt 74 may be fastened to the fourth bolt insertion portion 354 of the base 300 by sequentially passing through the fourth cover fixing hole formed in the fourth cover fixing surface 140 and the fourth board fixing hole 224 of the circuit board 200.

As described above, the first, third, and fourth bolts 71, 73, and 74 may simultaneously fix the cover 100, the circuit board 200, and the base 300. The second bolt 72 may simultaneously fix the cover 100, the second conductive support member 420, the circuit board 200, and the base 300.

In addition to the first to fourth bolts, an additional bolt for fixing the circuit board 200 to the base 300 may be provided. Referring to FIG. 3, as described above, a bolt may be fastened to the fifth bolt insertion portion 363 of the base 300 by sequentially passing through the through-hole 417 formed in the board fixing surface 411 of the first conductive support member 410 and the fifth board fixing hole 233 of the circuit board 200. In addition, a bolt may be fastened to the sixth bolt insertion portion 364 of the base 300 by passing through the sixth board fixing hole 235 of the circuit board 200.

A plurality of ventilation holes 161 and 163 may be formed in the cover body 150. The plurality of ventilation holes may be holes that extend downwardly from an upper edge to a sidewall of the cover body 150. The ventilation holes 161 and 163 may be arranged to be parallel and spaced apart from each other. Referring to FIG. 2, the plurality of ventilation holes 161 and 163 may be formed in the sidewalls of the cover body 150. In this state, the plurality of ventilation holes may be formed in sidewalls that opposite to each other such that air that enters through one sidewall may be exhausted through another sidewall opposite to the one sidewall.

A stepped portion may be formed at the edge of the cover body 150 that contacts the plurality of sidewalls of the base 300. A stepped portion may also be formed at the plurality of sidewalls of the base 300. The stepped portion at the edge of the cover body 150 and the stepped portion at the plurality of sidewalls of the base 300 may engage with each other.

Figure 6:
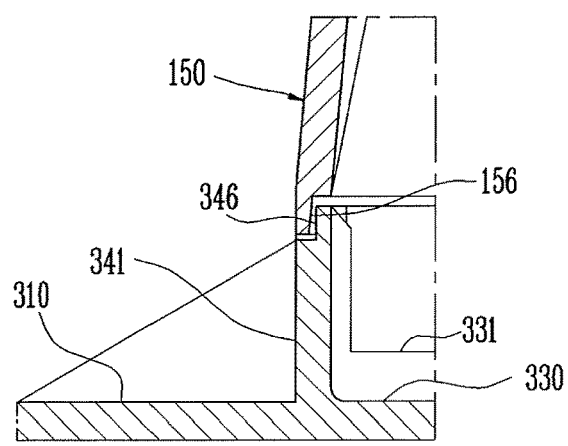
FIG. 6 illustrates a sectional view taken along line I-I of FIG. 2.

Referring to FIG. 6, a stepped surface 346 recessed from an outer surface of the first sidewall 341 may be formed at an upper end frame of the first sidewall 341, and a stepped surface 156 recessed from an inner surface of the cover body 150 may be formed at a lower end frame of the front surface of the cover body 150. As such, a stepped surface recessed from the inside of the cover body 150 may be formed at the lower end frame of the cover body 150, and a stepped surface recessed from the outside of the sidewall of the base 300 may be formed at the upper end frame of the sidewall of the base 300, such that the stepped surfaces may engage with each other.

At least one of the plurality of conductive support members 410 and 420 may serve as a ground by being electrically connected to a ground line of the circuit board 200.

Figure 8:
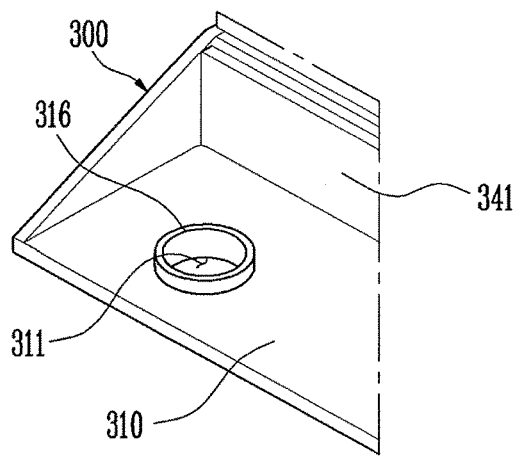
FIG. 8 illustrates a perspective view of an embodiment of a case fixing hole illustrated in FIG. 3.
Figure 9:
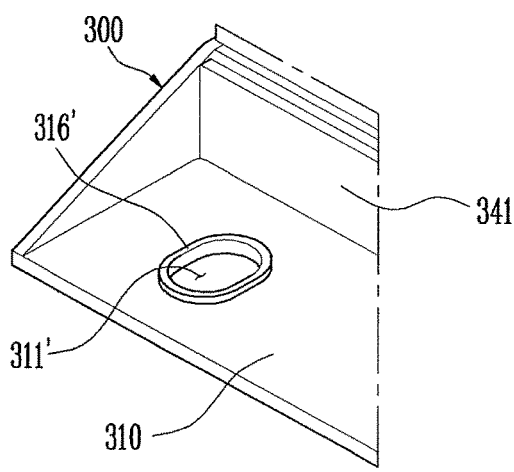
FIG. 9 illustrates a perspective view of an embodiment of the case fixing hole of FIG. 3.

Other embodiments of the case fixing hole will be described in detail with reference to FIGS. 8 and 9. Referring to FIG. 8, the first case fixing hole 311 may be provided with a reinforcing rib 316 extending upwardly from the circumference thereof. The durability of the first case fixing hole 311 may be improved by the reinforcing rib 316, and a bolt may be firmly fastened to the first case fixing hole 311. Similarly, reinforcing ribs are provided to the second to fifth case fixing holes 312, 313, 321, and 322, respectively.

In some implementations, the case fixing hole may have a shape other than a circular shape, such as, for example, an elliptical shape. A first case fixing hole 311' according to an embodiment may be an elliptical hole extending in the extending direction of the first flange 310. A reinforcing rib 316' extending upward from the circumference of the elliptical hole may also be formed in an elliptical shape. The first case fixing hole 311' may facilitate position adjustment of the plastic case when the plastic case is fastened to an arbitrary object or location by a bolt.

Figure 10:
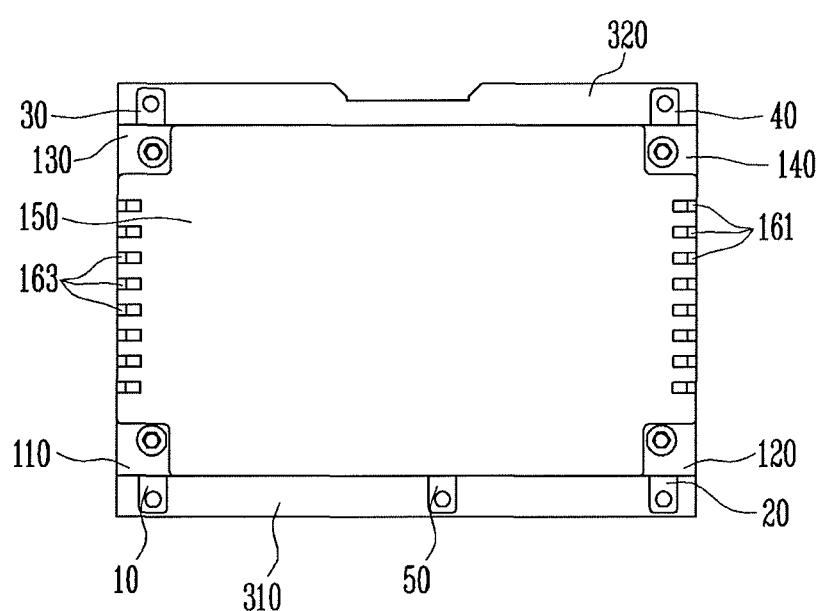
FIG. 10 illustrates a top view of a device according to an embodiment.

FIG. 10 is a top view of a device according to an embodiment.

The device of FIG. 10 may include a plastic case 100 and 300, a circuit board 200, and five conductive support members 10, 20, 30, 40, and 50. The five conductive support members may include first to fifth conductive support members 10, 20, 30, 40, and 50. The first to fourth conductive support members 10, 20, 30 and 40 may be fastened to first to fourth cover fixing surfaces 110, 120, 130, and 140, respectively. The first to fifth conductive support members 10, 20, 30, 40, and 50 may have the same configuration as the first conductive support member 410 of FIG. 7, and therefore, their detailed descriptions will not be repeated.

The fifth conductive support member 50 may have the same configuration and connection to the circuit board 200, etc. as the first conductive support member 410 of FIG. 3, and therefore, a detailed description thereof will not be repeated. In addition, the device of FIG. 10 may be identical to the embodiment described with reference to FIGS. 1 to 9 except that the first, second, and fourth conductive support members are further provided. Therefore, detailed descriptions of the plastic case 100 and 300, the circuit board 200 and their connection relationship will not be repeated.

According to the configuration described above, corner portions of the circuit board may be firmly fixed to the plastic case by the respective first to fourth conductive support members 10, 20, 30, and 40. Also, at least one of the first to fifth conductive support members 10, 20, 30, 40, and 50 may serve as a ground by being electrically connected to a ground line of the circuit board 200.

By way of summation and review, a plurality of devices may be electrically connected to at least one device that performs an integrated control function such that a desired device among the plurality of devices is selectively controlled. When a plurality of devices are integrally controlled, a device that electrically connects between the plurality of controlled devices and at least one device that performs a control function may be provided. Each of the these devices may include a circuit board on which elements are mounted and a case that accommodates the circuit board and protects the circuit board from the outside. In this case, the device may have weak durability and a complicated configuration for assembly.

In contrast, embodiments provide a device having a circuit board, the device having a light weight and improved durability. Embodiments also provide a device having a circuit board, the device having improved assembly properties. According to embodiments, a plastic case and metal support members are provided, thereby improving the durability of the device. Also, the assembling structure of the device according to embodiments is simple, such that the assembling process of the device can be simplified. Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A device, comprising:
a circuit board extending in a horizontal direction;
a plastic case accommodating and surrounding the circuit board therein, the plastic case protecting the circuit board; and
a plurality of conductive support members supporting the circuit board such that the circuit board is fixed to the plastic case, each of the plurality of conductive support members including a board fixing portion and a stepped portion, wherein:
the board fixing portion of each conductive support member extends in the horizontal direction along a surface of the circuit board and is fixed to the circuit board inside the plastic case, and
the stepped portion of each conductive support member bends from the board fixing portion downwardly and extends toward outside the plastic case such that the stepped portion is externally exposed from the plastic case.

2. The device as claimed in claim 1, wherein the plastic case includes:
a base on which the circuit board is mounted; and
a cover covering the circuit board, the cover fastened to the circuit board and the base,
wherein the plurality of conductive support members extend toward the outside of the plastic case between the cover and the circuit board.

3. The device as claimed in claim 2, wherein:
the plurality of conductive support members include first and second conductive support members,
the first conductive support member is fastened to the circuit board and the base inside the plastic case, and the second conductive support member is fastened to the cover, the circuit board, and the base inside the plastic case.

4. The device as claimed in claim 3, further comprising a first fastening bolt that fastens the first conductive support member to the base by sequentially passing through the first conductive support member and the circuit board.

5. The device as claimed in claim 3, further comprising a second fastening bolt that fastens the second conductive support member to the base by sequentially passing through the cover, the second conductive support member, and the circuit board.

6. The device as claimed in claim 3, wherein the second conductive support member is fixed to the cover, the circuit board, and the base at a corner of the cover.

7. The device as claimed in claim 2, wherein the base includes:
- a plurality of sidewalls surrounding an edge of the circuit board; and
- a plurality of guide ribs protruding toward the edge of the circuit board to guide a mounting position of the circuit board.

8. The device as claimed in claim 7, wherein:
- a first stepped portion is provided at the sidewalls of the base to engage with an edge of the cover, and
- a second stepped portion is provided at the edge of the cover to engage with the first stepped portion of the sidewalls of the base.

9. The device as claimed in claim 2, wherein the base includes a flange extending outwardly, the flange including at least one fixing hole having a reinforcing rib extending upwardly from a circumference thereof.

10. The device as claimed in claim 2, wherein each of the plurality of conductive support members includes a case fixing portion, the case fixing portion bending from the stepped portion of each conductive support member and extending along an external surface of the base.

11. The device as claimed in claim 1, wherein at least one of the plurality of conductive support members is electrically connected to a ground line of the circuit board.

12. The device as claimed in claim 1, further comprising a plurality of elements mounted on the circuit board, the plurality of elements including at least one of a connection terminal, a relay, a fuse, a field effect transistor (FET), an integrated circuit (IC), a positive temperature coefficient (PTC), and a switching element.

13. The device as claimed in claim 1, wherein
the board fixing portion of each of the plurality of conductive support members includes a through hole.

14. The device as claimed in claim 2, wherein
the base includes a side wall extends upwardly from a top surface of the base and surrounds an edge of the circuit board, and wherein
the side wall of the base includes a guide groove, the guide groove being recessed downwardly and guiding the stepped portion of each conductive support member.

* * * * *